US005457389A

United States Patent [19]

Shibata

[11] Patent Number: 5,457,389

[45] Date of Patent: Oct. 10, 1995

[54] METHOD OF TESTING SUBSTRATE FOR LIQUID JET RECORDING HEAD

[75] Inventor: Makoto Shibata, Hiratsuka, Japan

[73] Assignee: Canon Kabushiki Kaisha, Tokyo, Japan

[21] Appl. No.: 148,529

[22] Filed: Nov. 8, 1993

Related U.S. Application Data

[60] Continuation of Ser. No. 719,152, Jun. 21, 1991, abandoned, which is a division of Ser. No. 441,219, Nov. 28, 1989, Pat. No. 5,049,231, which is a continuation of Ser. No. 357,950, May 30, 1989, abandoned, which is a continuation of Ser. No. 244,618, Sep. 15, 1988, abandoned, which is a continuation of Ser. No. 170,625, Mar. 17, 1988, abandoned, which is a continuation of Ser. No. 096,234, Sep. 8, 1987, abandoned, which is a continuation of Ser. No. 945,903, Dec. 24, 1986, abandoned.

[30] Foreign Application Priority Data

Dec. 27, 1985 [JP] Japan .................................. 60-297218

[51] Int. Cl.$^{6}$ .................................................. H01L 21/306

[52] U.S. Cl. ........................... 324/514; 324/765; 324/557

[58] Field of Search .................................... 156/627, 651; 324/158 R, 524, 765, 557

[56] References Cited

U.S. PATENT DOCUMENTS

| | | | |
|---|---|---|---|
| 4,281,449 | 8/1981 | Ports | 324/158 R |
| 4,536,250 | 8/1985 | Ikeda et al. | 156/65 |
| 4,621,037 | 11/1986 | Kanda | 156/627 |
| 4,626,875 | 12/1986 | Hara et al. | 346/140 R |
| 4,672,314 | 6/1987 | Kokas | 324/158 R |
| 4,694,306 | 9/1987 | Ikeda et al. | 346/140 R |
| 4,777,494 | 10/1988 | Shibata et al. | 346/1.1 |
| 5,013,394 | 5/1991 | Rolland | 156/627 |
| 5,097,205 | 3/1992 | Toyoda | 324/158 R |

FOREIGN PATENT DOCUMENTS

| | | | |
|---|---|---|---|
| 2325665 | 12/1974 | Germany | 156/627 |
| 0023851 | 2/1982 | Japan | 324/551 |

OTHER PUBLICATIONS

Bogardas et al. Pinhole Detector In Insulating Films, Apr. 1978, IBM Tech. Disc. Bull, vol. 20, No. 11B, pp. 4967–4968.

*Primary Examiner*—Kenneth A. Wieder
*Assistant Examiner*—Jose M. Solis
*Attorney, Agent, or Firm*—Fitzpatrick, Cella, Harper & Scinto

[57] ABSTRACT

A method for detecting an insulative condition of a protection layer of a substrate includes the steps of contacting an area of a surface of a protection layer to be detected with a liquid, and checking the electrical conduction between the liquid and a detection electrode which is electrically connected with an electrical element at an area on which the protection layer is not provided.

11 Claims, 8 Drawing Sheets

METHOD OF TESTING SUBSTRATE FOR LIQUID JET RECORDING HEAD

This application is a continuation of application Ser. No. 07/719,152 filed Jun. 21, 1991, now abandoned and which was a division of application Ser. No. 07/441,219 filed Nov. 28, 1989, now U.S. Pat. No. 5,049,213, which is a continuation of application Ser. No. 07/357,950, filed May 30, 1989, now abandoned, which in turn is a continuation of application Ser. No. 07/244,618, filed Sep. 15, 1988, now abandoned, which in turn is a continuation of application Ser. No. 07/170,625, filed Mar. 17, 1988, now abandoned, which in turn is a continuation of application Ser. No. 07/096,234, filed Sep. 8, 1987, now abandoned, which in turn is a continuation of application Ser. No. 06/945,903, filed Dec. 24, 1986, now abandoned.

BACKGROUND OF THE INVENTION

1. Field of the Invention

The present invention relates to a method of manufacturing a liquid jet recording head and, more particularly, to a method of allowing easy detection of a defect in a protective layer on a recording head.

2. Related Background Art

One of the factors determining reliability of a liquid injection recording head is the presence/absence of a defect in a protective layer formed thereon. As described in U.S. Pat. Nos. 4,536,250 and 4,602,261, if defects such as pinholes or cracks occur in such protective layers, a liquid such as (ink) enters inside the recording head through the defects to corrode electrodes and heating resistor layers. In this case, if a conductive liquid is used, an electrical short circuit is formed to prevent normal injection of the liquid. In order to minimize the defects in the protective layer or the like, materials and structures of the protective layers must be properly selected, and a careful consideration must be made of the method of forming such layers.

In order to obtain a satisfactory result, a test is normally performed to detect the present/absence of defects in the protective layer during the recording head fabrication process, thereby further improving reliability of the recording head.

A typical example of a method of testing the protective layer is shown as an illustrative sectional view in FIG. 1. A portion of a recording head substrate 12 having a protective layer 15 is dipped in an ink or electrolytic solution 17 contained in a conductive vessel 16, and a voltage is applied across a bonding pad 19 of the recording head and the vessel.

If a defect is present in the protective layer 15, a current is supplied between the vessel 16 and the bonding pad through the electrolytic solution 17. By detecting the current, the presence of the protective layer 15 can be easily discriminated.

Further, the bonding pad serves as an anode, and a material of the electrolytic solution 17 is selected according to the materials of electrodes 14 and/or heating resistor layer 13 to enable the application of anodic oxidation to the electrode 14 corresponding to the defect of the protective layer 15 and/or a heat resistor layer 13.

Therefore, the repairing of the defect can be executed together with the testing at the same time.

This test method is utilized during the fabrication process before the recording head is finished, and defective heads are not fed to the subsequent process, thus providing an economical advantage in favor of fabrication process.

However, since a test electrode 18 must be attached to the bonding pad of the recording head, the bonding pad 19 may be damaged at the time of test electrode attachment, and objects such as dust particles may be undesirably attached to the bonding pad. Furthermore, if a plurality of electric-thermal converters are used, test electrodes must be attached to the electrodes of the respective converters, thus degrading the test efficiency.

SUMMARY OF THE INVENTION

The present invention has been made in consideration of the above situation, and has as an object to provide a method of testing a liquid injection recording head which does not damage a bonding pad and has a high testing efficiency, and a liquid injection recording head suitable for employing the above method.

In order to achieve the above object of the present invention, there is provided a method of manufacturing a liquid injection recording head having an orifice for injecting a liquid therethrough, a flow path communicating with the orifice, and an electric-thermal converter, the converter being provided with at least a heating resistor layer, formed in the flow path to generate energy, for injecting the liquid, and with a pair of electrodes electrically connected to the heating resistor layer, including the step of electrically disconnecting, after at least one of the pair of electrodes is connected to a common electrode, the electrode connected to the common electrode therefrom.

DETAILED DESCRIPTION OF THE PREFERRED EMBODIMENTS

One recording head in a recording apparatus employing a manufacturing method according to the present invention comprises: a liquid jet mechanism including an orifice for injecting the liquid therethrough and a liquid path partially constituted by a heat conducting portion in which heat energy is applied to the liquid; and an electric-thermal converter as a means for generating the heat energy.

The electric-thermal converter comprises a pair of electrodes and a heating resistor layer connected to the pair of electrodes to constitute a heating area (i.e., a heat generator) between the pair of electrodes.

Figure 1:
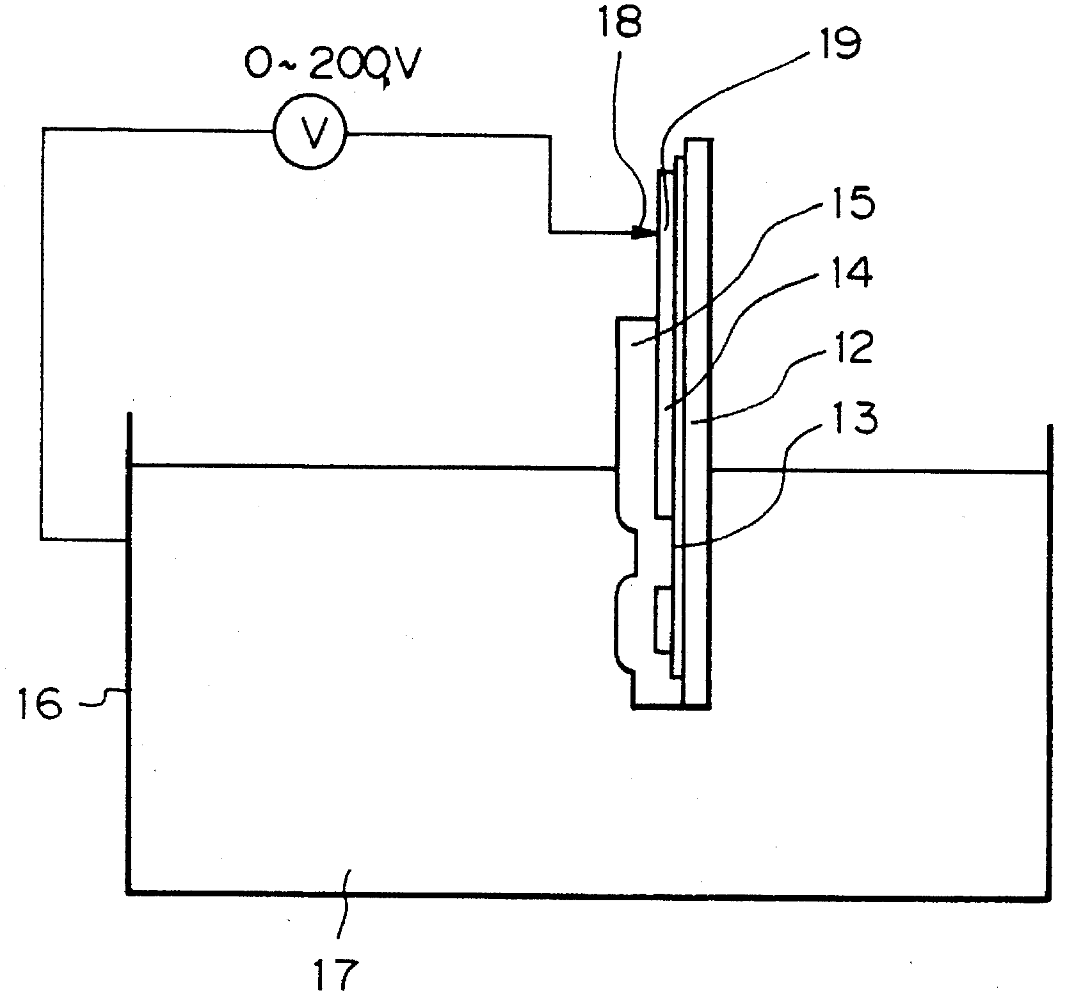
FIGS. 1, 6 and 9 are respectively schematic views of cross-sectional view for explaining the testing of an ink jet recording head.
Figure 2A:
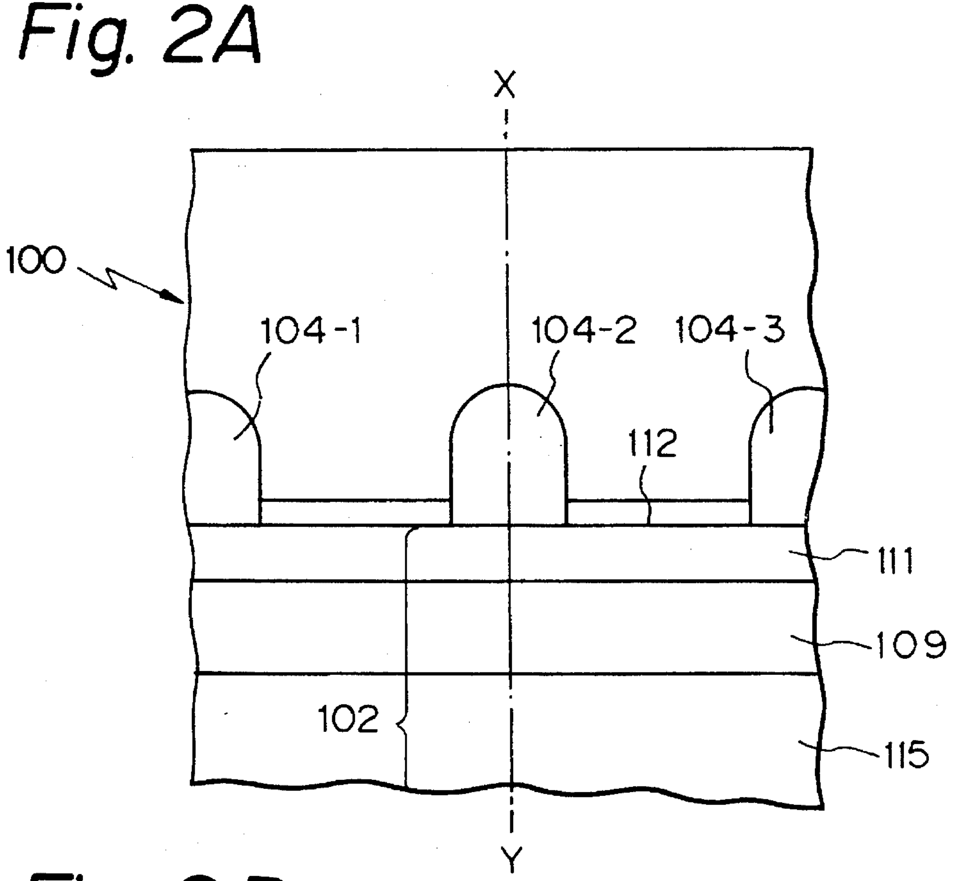
FIGS. 2A, 2B, 2C and 3 show structures of an ink jet recording head according to the present invention.
Figure 2B:
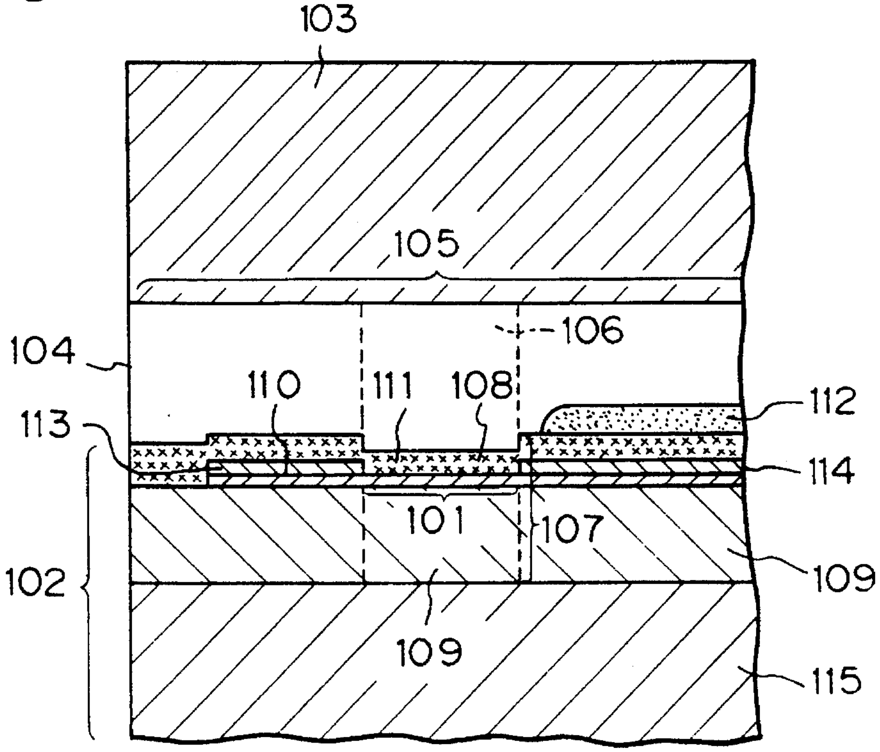
Figure 2C:
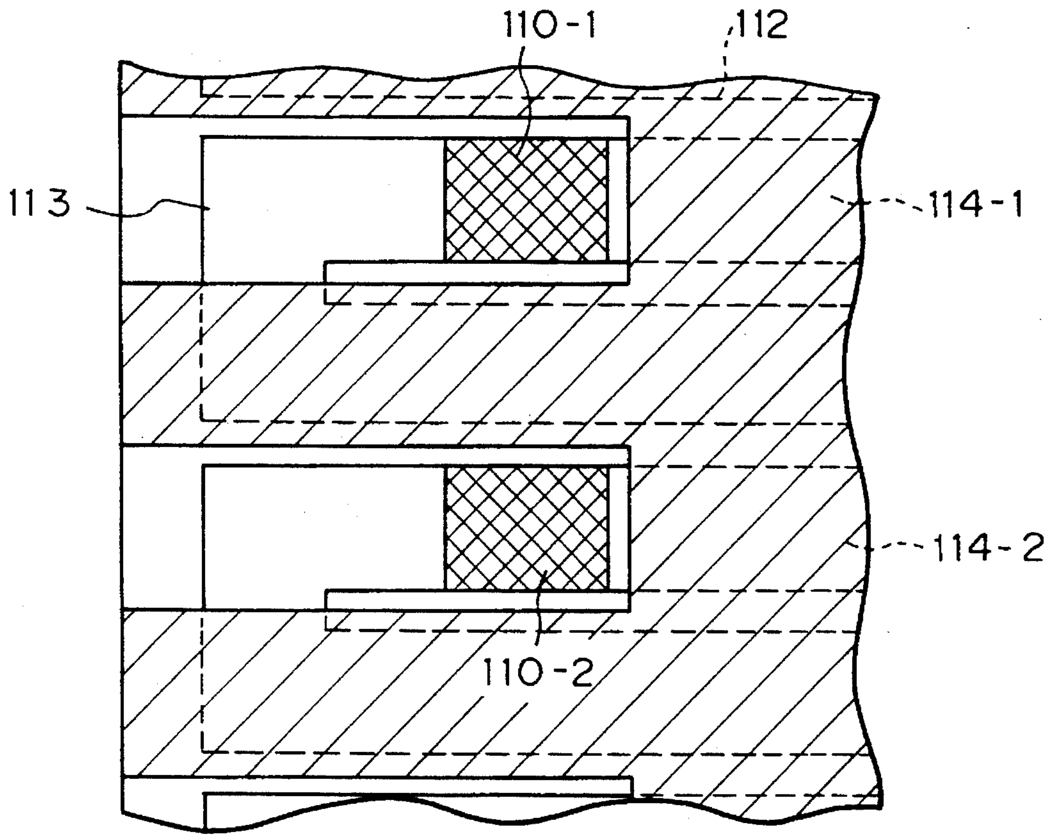

FIGS. 2A, 2B and 2C are structures of a liquid jet recording head according to the present invention. FIG. 2A is a partial front view of a liquid jet recording head when viewed from its orifice side, FIG. 2B is a partial sectional view thereof when taken along an alternate long and short dashed line XY, and FIG. 2C is a plan view of a substrate.

A recording head 100 has a structure wherein the surface of a substrate 102 having an electric-thermal converter 101 thereon is covered with a grooved plate 103 having a predetermined number of grooves at a predetermined density. Each groove has a predetermined width and depth. The above structure constitutes orifices 104 and liquid ejection or injection portions 105. In the recording head shown in FIGS. 2A to 2C, a plurality of orifices 104-1, . . . are formed. However, the present invention is not limited to such a recording head but can include a recording head having a single orifice.

The liquid jet portion 105 comprises the orifice 104 at the distal end thereof and a heat conducting portion 106 for generating bubbles upon causing thermal energy from electric-thermal converter 101 to radiate the liquid and for causing abrupt changes in state of the liquid depending on expansion/contraction of its volume.

The heat conducting portion 106 is located above a heat generating portion 107 of the electric-thermal converter 101. The bottom surface of the heat conducting portion 106 serves as a heat conducting surface 108 which is in contact with the liquid in the heat generating portion 107.

The heat generating portion 107 comprises a lower layer 109 formed on the substrate 102, a heating resistor layer 110 formed on the lower layer 109, and a first protective layer 111 formed on the heating resistor layer 110. Electrodes 113 and 114 are formed on the heating resistor layer 110 to generate heat upon energization of electrodes 113 and 114. The electrode 113 is the common electrode for the heat generating portions of the liquid jet portions of the recording head. The electrode 114 serves as a selection electrode for selecting one of the heat generating portions and is formed along the liquid path of each injection portion.

In the heat generating portion 107, the first protective layer 111 chemically and physically isolates the heating resistor layer 110 from the liquid filled in the liquid path of the liquid jet portion 105, and at the same time has a protective function of the heating resistor layer 110 so as to prevent the electrode 113 from being short-circuited with the electrode 114 through the liquid. In addition, the first protective layer 111 serves to prevent electric leakage between the adjacent electrodes. It is important to prevent electric leakage between the selection electrodes and prevent the energized electrode under each liquid path from being in contact with the liquid. For this purpose, the first protective layer 111 having the above-mentioned protective function is formed at least on the electrode located under the corresponding flow path.

The upstream side of the flow path formed in each liquid injection portion communicates with a common liquid chamber (not shown) for storing the liquid to be supplied to the flow path. The electrode connected to the electric-thermal converter arranged at each liquid injection portion normally passes under the common liquid chamber at the upstream side of the heat conducting portion as a favored construction. Therefore, the above-mentioned upper layer is normally formed in this portion so as to prevent the electrode from being brought into contact with the liquid.

The grooved plate 103 is prepared by molding or cutting a material such as glass, ceramic, or plastic. The grooved plate 103 is formed to cover the substrate 102 to constitute the flow path. Alternatively, a flow path wall of a photosetting resin is formed on the substrate 102, and a flat plate made of glass, ceramic, plastic, or a metal is bonded to the flow path wall to constitute a flow path.

Figure 3:
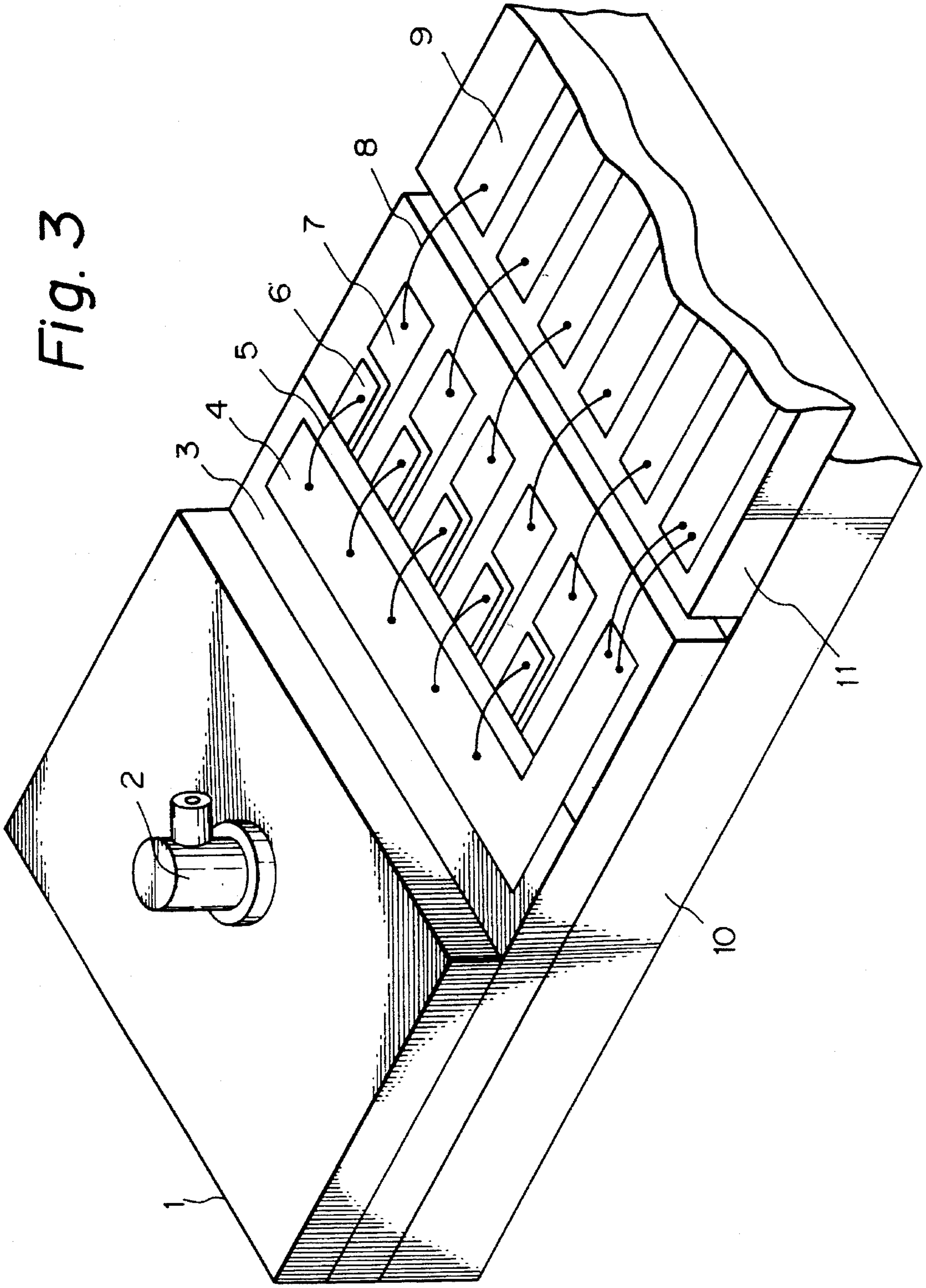

A liquid jet drive signal is input to the electrode connected to the electric-thermal converter. External electric connections to the electrodes of the liquid injection recording head are shown in a perspective view in FIG. 3. More specifically, the liquid injection recording head and a wiring board having external connecting wires 9, e.g., flexible cables are arranged on a support 10. Bonding pads 6 arranged at electrode ends of the liquid injection recording head are connected to a common pad 4 through bonding wires 5. The common pad 4 is also electrically connected to the external connecting wires 9 through corresponding bonding wires 8.

Figure 4:
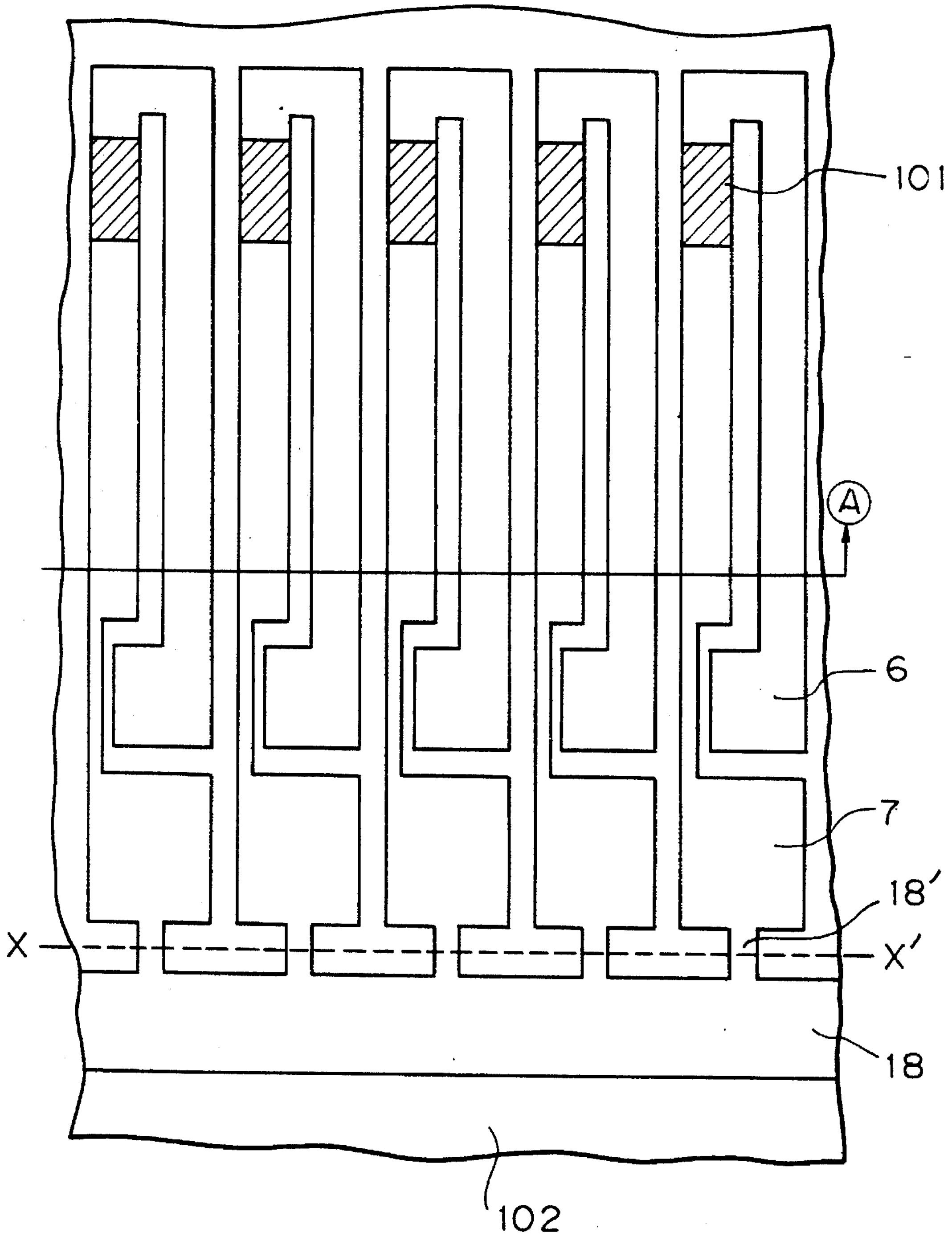
FIGS. 4, 5, 7 and 8 are schematic views of plane for explaining the present invention.

FIG. 4 is a schematic plan view of a support for supporting an electric-thermal converter used in the liquid injection recording head according to the present invention. As shown in FIG. 4, one of the electrodes of the electric-thermal converter is electrically connected to a common electrode 18 through a connecting portion 18'.

The substrate (i.e., a recording head substrate) used in the liquid jet recording head according to the present invention is prepared by further forming a protective layer on the structure shown in FIG. 4.

In order to test whether a defect is present in the finished recording head substrate according to the test method as previously described, a portion indicated by arrow Ⓐ is dipped in a testing electrolytic solution, and a voltage is applied between the electrolytic solution and the common electrode 18 (FIG. 4).

According to the present invention, a probe need not be connected to each bonding pad itself. Unlike in the conventional case, cumbersome operation is not required and the bonding pads are not contaminated or damaged.

The connecting portion 18' is electrically disconnected after testing to provide the same recording head as the conventional recording head.

Electric disconnection of the connecting portion 18' is performed by a mechanical means such as dicing along the broken line XX' of FIG. 4, chemical polishing (e.g., etching), or optical energy cutting using a laser beam or the like.

Steps in manufacturing a recording head will be described in detail.

Figure 5:
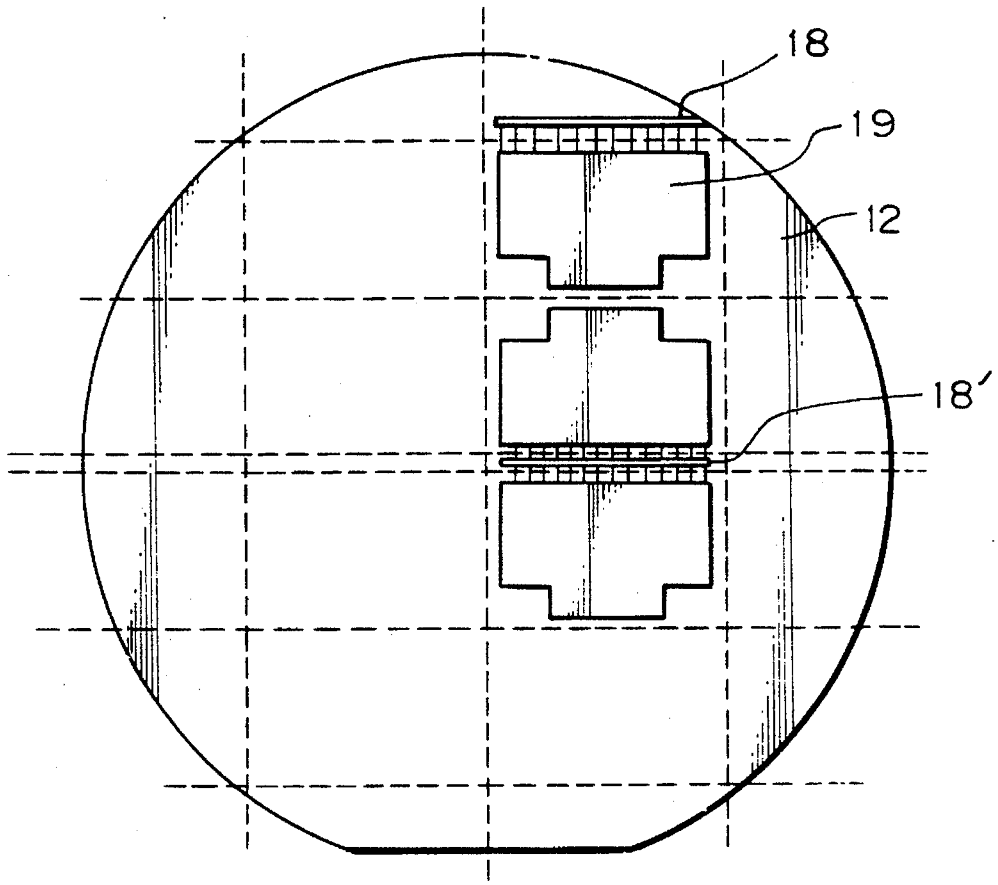

FIG. 5 is a schematic plan view of a liquid jet recording head having a protective layer. As shown in FIG. 5, a plurality of liquid jet recording heads are formed on a support substrate 12. The recording heads are scribed or cut into pieces along the broken lines. If required, the orifices are further cut to prepare the recording heads.

As shown in FIG. 5, a common electrode 18 is electrically connected to bonding pads (not shown) of recording heads during the fabrication process.

Figure 6:
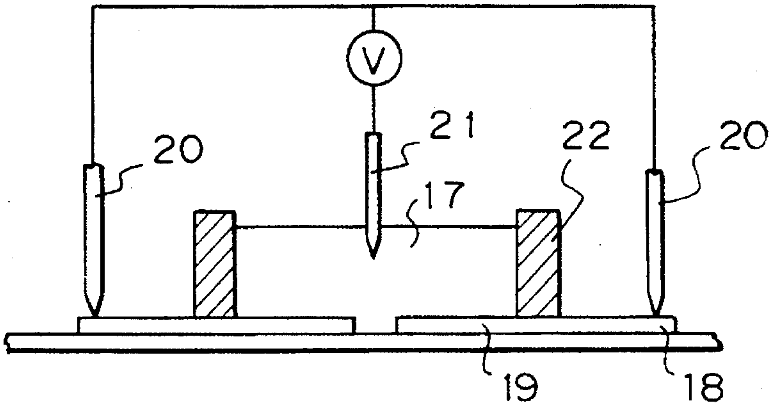

A test for checking the presence/absence of a defect or the like of a protective layer is performed, as indicated in the schematic sectional view in FIG. 6. In a state wherein a large number of recording heads are formed, walls 22 of silicon resin or the like are formed on a necessary portion (i.e., a portion subjected to the above-mentioned test) in units of recording heads 19 so as to store an electrolytic solution 17 therein.

A voltage is applied between the electrolytic solution 17 and the common electrode 18 through a test electrode 21 or a probe 20 to perform the test.

After the walls 22 are removed, the tested portion is cleaned. Liquid paths, liquid chambers, and the like are formed to prepare recording heads. Thereafter, the support substrate 12 is scribed and divided into pieces in units of recording heads, thereby preparing the recording heads. When the method described with reference to FIG. 5 is practiced, i.e., a large number of recording heads are prepared, electric connections between the bonding pads and the common electrode 18 can be disconnected at the time of scribing or cutting of the substrate at the position of the connecting portion 18'.

When a plurality of recording heads are prepared by a single substrate and the direction for supplying the liquid to the energy activating portion is the same as that of jetting the liquid, orifices can be formed by scribing or cutting, thereby effectively preparing the recording heads.

Figure 7:
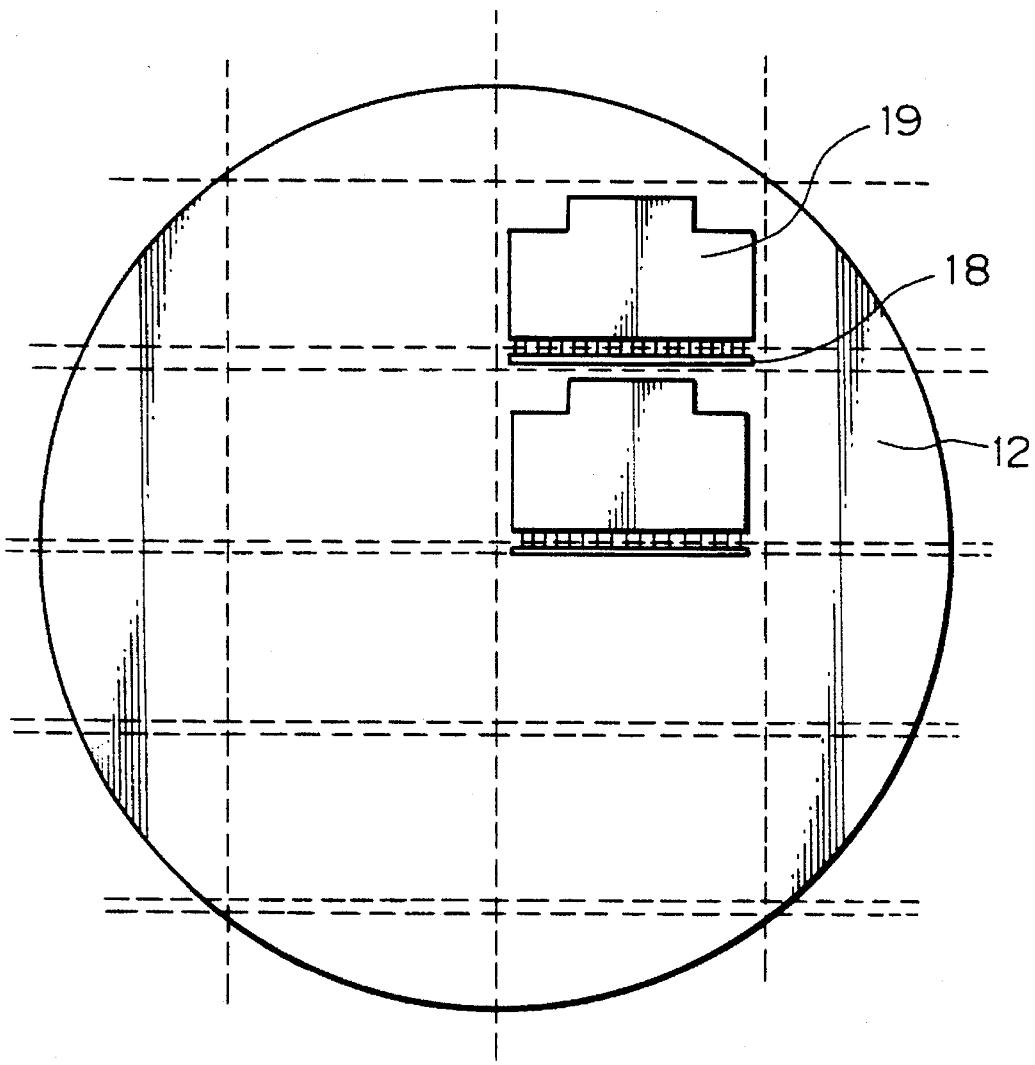

FIG. 7 shows a case similar to FIG. 5 wherein a plurality of recording heads are prepared by a single substrate. According to the method in FIG. 7, the common test electrodes are formed in units of recording heads to result in a disadvantage from the viewpoint of effective utilization of the support substrate 12. However, this disadvantage does not pose a further problem if the recording heads are respectively formed in desired areas. Therefore, from the viewpoint of fabrication process, the disadvantage does not cause inconvenience. When the substrate is cut into pieces by dicing, the width of the common electrode can be used as a scribing margin, and scribing effectively allows elimination of the common electrodes.

Figure 8:
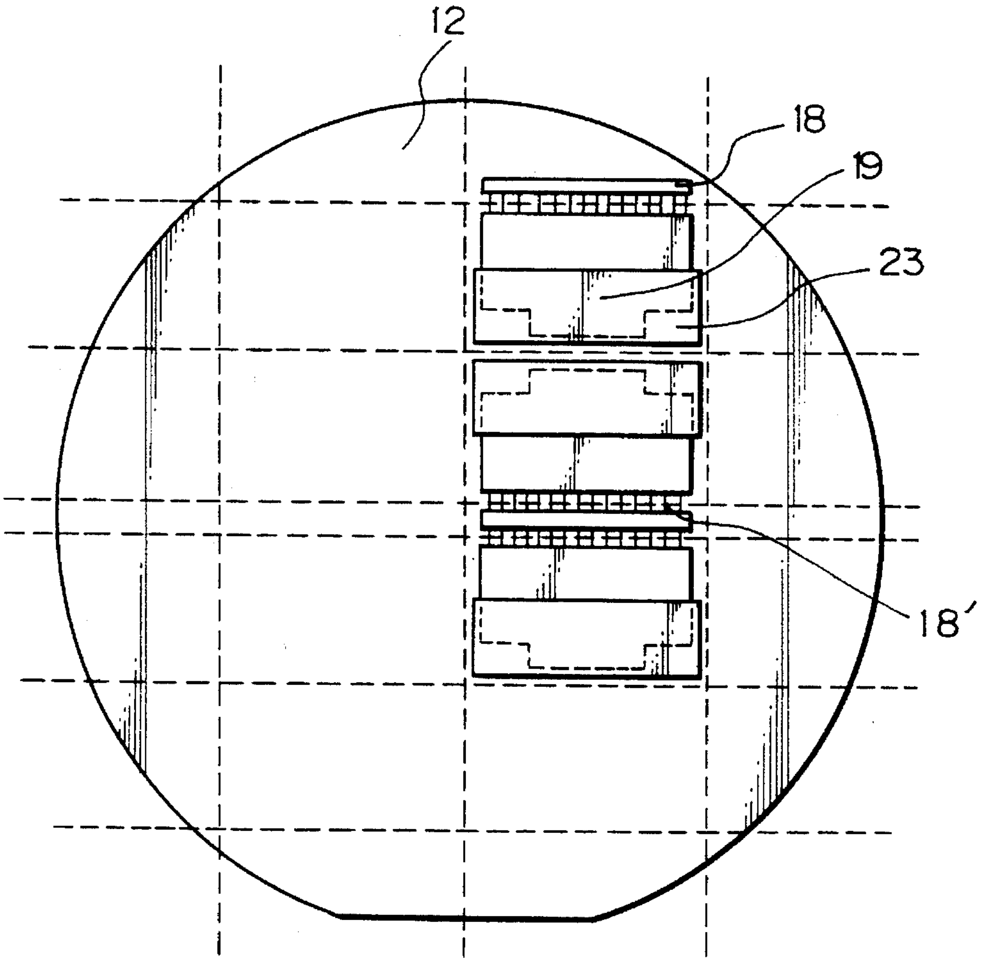
Figure 9:
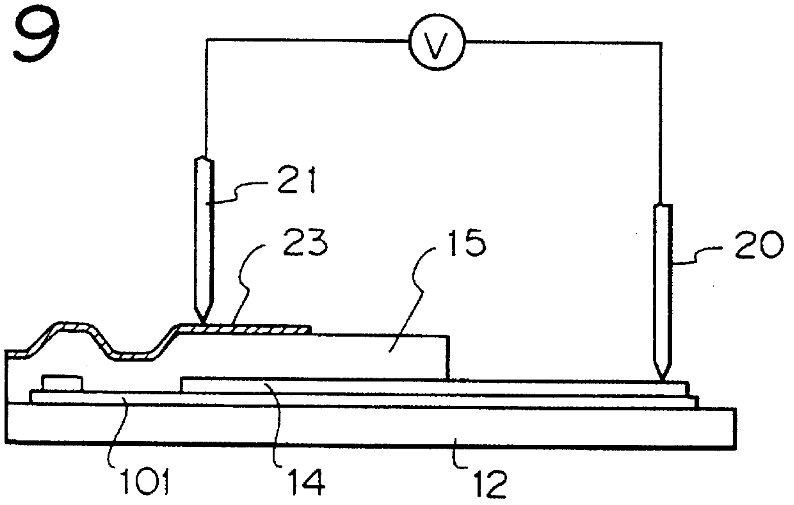

FIG. 8 is a schematic plan view showing another embodiment of the present invention. The same reference numerals as in FIG. 5 denote the same parts in FIG. 8, and a detailed description thereof will be omitted. Referring to FIG. 8, the structure includes an anti-cavitation layer 23. The anti-cavitation layer 23 is formed as a protective layer for protecting a heating resistor element (an electric-thermal converter) from cavitation caused by collapsing bubbles generated upon driving of the recording head. The anti-cavitation layer is made of a material with ink resistance, such as Ta and SUS, in addition to the above-mentioned protective layer. With this arrangement, in addition to the test method using the electrolytic solution, a voltage may be applied between a common electrode 18 and an anti-cavitation layer 23, as indicated by the schematic sectional view of FIG. 9, and the electric conduction is measured to detect a defect of a protective layer 15. In this case, the common electrode 18 plays an important role in the fabrication of recording heads as in the previous embodiments.

According to the present invention, satisfactory recording heads can be effectively discriminated from defective recording heads during their fabrication. During fabrication, repair can be performed on the real-time basis. Therefore, defective products are not fed to the subsequent step, thereby improving the yield of recording heads.

In addition, according to the present invention, damage and contamination of the bonding pads can be substantially eliminated to prevent accidental damage during the test.

Besides, a fabrication method of an ink jet recording head according to the present invention is not limited to be the above stated method.

For example, although, in FIG. 4, the electrodes 6 and 7 on the substrate 102 have the common electrode 18 at the side (the lower side in FIG. 4) from which the electrodes are extended, the common electrode may be provided at the side (the upper side in FIG. 4) which the orifice is provided and the electrodes are connected with one another through the common electrode.

In the above case, the detection as to whether or not the protective layer has defects is performed between an electrode on which the liquid path is formed and the common electrode provided at the side of the orifice.

Further the edge of the substrate 102 which forms an orifice surface may be formed at the same time by the cutting of the electrodes from the common electrode.

I claim:

1. A method for detecting an insulative condition of a protection layer of a substrate, the substrate comprising a plurality of heating resistors arranged in an arrangement direction in a pair of rows, a pair of electrodes connected to the heating resistors, the protection layer provided on said heating resistors and paired electrodes, and a plurality of pad portions, each said pad portion being electrically connected to one of the electrodes, said pad portions being suitable for connection to an electrical contact which is external to the substrate, said detecting method comprising the steps of:

dipping at least an area of the substrate other than a portion where the pad portions are disposed, a detection electrode connected in common to said plural pad portions and which is arranged in the arrangement direction in which the heating resistors are provided, into an electrolyte solution;

checking an electrical condition of the protection layer by connecting a probe electrode to the detection electrode and applying a voltage between the detection electrode and the electrolyte solution; and cutting the detection electrode after said checking step.

2. A detecting method according to claim 1, wherein a plurality of electrical elements are disposed on the substrate, and in said checking step, the detection electrode is electrically connected to the plurality of electrical elements commonly.

3. A detecting method according to claim 1, wherein the substrate has a plurality of element units each comprising a plurality of electrical elements, the protection layer and a common detection electrode, each common detection electrode is electrically connected to each plurality of electrical elements commonly for detection in said checking step.

4. A detecting method according to claim 2, wherein each electrical element comprises an electrical/thermal converting member for an ink jet recording head, and a supply electrode connected thereto.

5. A detecting method according to claim 3, wherein each electrical element comprises an electrical/thermal converting member and a supply electrode connected thereto, and each of the plural element units corresponds to a recording head.

6. A method for detecting an insulative condition of a protection layer of a substrate, the substrate comprising a plurality of heating resistors arranged in an arrangement direction in a pair of rows, a pair of electrodes connected to the heating resistors, the protection layer provided on said heating resistors and paired electrodes, and a plurality of pad portions, each said pad portion being electrically connected to one of the electrodes, said portions being suitable for connection to an electrical contact which is external to the substrate, and a metal layer provided on the protection layer, said method comprising the steps of:

checking an electrical condition of the protection layer by connecting a probe electrode to a detection electrode commonly connected to the plural pad portions and arranged in the arrangement direction of the heating resistors and to the metal layer; and cutting the detection electrode after said checking step.

7. A method for detecting and repairing an insulative condition of a protection layer of a substrate, the substrate comprising a plurality of heating resistors arranged in an arrangement direction in a pair of rows, a pair of electrodes connected to the heating resistors, the protection layer provided on said heating resistors and paired electrodes, and a plurality of pad portions, each said pad portion being electrically connected to one of the electrodes, said pad portions being suitable for connection to an electrical contact which is external to the substrate, said detecting method comprising the steps of:

dipping at least an area of the substrate other than a portion where the pad portions are disposed, a detection electrode connected in common to said plural pad portions and which is arranged in the arrangement direction in which the heating resistors are provided, into an electrolyte solution;

checking an electrical condition of the protection layer by connecting a probe electrode to the detection electrode and applying a voltage between the detection electrode and the electrolyte solution, wherein the detection electrode functions as an anode and the liquid functions as a cathode;

simultaneously with said checking step, anode oxidating a part of the electrical element corresponding to a defect portion thereof by maintaining and electric supply to the protection layer if the electrical conduction is found; and cutting the detection electrode after said checking step.

8. A detecting method according to claim 7, wherein a plurality of electrical elements are disposed on the substrate, and in said checking step the detection electrode is electrically connected to the plurality of electrical elements commonly.

9. A detecting method according to claim 7, wherein the substrate has a plurality of element units each comprising a plurality of electrical elements, the protection layer and a common detection electrode, each common detection electrode is electrically connected to each plurality of electrical elements commonly for detection in said checking step.

10. A detecting method according to claim 8, wherein each electrical element comprises an electrical/thermal converting member for an ink jet recording head, and a supply electrode connected thereto.

11. A detecting method according to claim 9, wherein each electrical element comprises an electrical/thermal converting member and a supply electrode connected thereto, and each of the plural element units corresponds to a recording head.

* * * * *

UNITED STATES PATENT AND TRADEMARK OFFICE
CERTIFICATE OF CORRECTION

PATENT NO. : 5,457,389

DATED : October 10, 1995

INVENTOR(S) : MAKOTO SHIBATA

It is certified that error appears in the above-identified patent and that said Letters Patent is hereby corrected as shown below:

ON TITLE PAGE

In [56] References Cited, under U.S. PATENT DOCUMENTS: "Kokas" should read --Kokkas--.

In [56] References Cited, under OTHER PUBLICATIONS: "Bogardas et al." should read --Bogardus et al.--.

COLUMN 1

Line 30, "such" should read --(such--.
Line 31, "as (ink)" should read --as ink)--.
Line 37, "a" should be deleted.

COLUMN 3

Line 8, "radiate" should read --radiate to--.
Line 66, "cables" should read --cables,--.

COLUMN 5

Line 61, "Further" should read --Further,--.

UNITED STATES PATENT AND TRADEMARK OFFICE
CERTIFICATE OF CORRECTION

PATENT NO. : 5,457,389

DATED : October 10, 1995

INVENTOR(S) : MAKOTO SHIBATA

It is certified that error appears in the above-identified patent and that said Letters Patent is hereby corrected as shown below:

COLUMN 7

Line 15, "and" should read --an--.

Signed and Sealed this

Second Day of April, 1996

Attest:

Bruce Lehman

BRUCE LEHMAN

*Attesting Officer*

*Commissioner of Patents and Trademarks*